(12) United States Patent
Hori et al.

(10) Patent No.: US 8,547,139 B2
(45) Date of Patent: Oct. 1, 2013

(54) CMOS LOGIC INTEGRATED CIRCUIT

(75) Inventors: Chikahiro Hori, Kanagawa-ken (JP);
Akira Takiba, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/421,159

(22) Filed: Mar. 15, 2012

(65) Prior Publication Data

US 2013/0015883 A1    Jan. 17, 2013

(30) Foreign Application Priority Data

Jul. 11, 2011   (JP) .................. 2011-153101

(51) Int. Cl.
*H03K 19/0175*   (2006.01)
*H03K 19/094*    (2006.01)
*H03K 19/20*     (2006.01)
*H03B 1/00*      (2006.01)
*H03L 5/00*      (2006.01)

(52) U.S. Cl.
USPC ............... 326/81; 326/68; 326/112; 327/108; 327/333

(58) Field of Classification Search
USPC ............. 326/80–83, 68, 86, 87, 63, 112, 115, 326/126, 127; 327/108, 109, 333
See application file for complete search history.

(56) References Cited

U.S. PATENT DOCUMENTS

| | | | | |
|---|---|---|---|---|
| 5,670,905 A | * | 9/1997 | Keeth et al. | 327/333 |
| 5,952,847 A | * | 9/1999 | Plants et al. | 326/80 |
| 6,094,083 A | * | 7/2000 | Noda | 327/333 |
| 6,903,576 B2 | * | 6/2005 | Narwal | 326/68 |
| 7,208,979 B2 | | 4/2007 | Takiba | |
| 7,358,773 B2 | | 4/2008 | Takiba | |
| 7,839,172 B2 | | 11/2010 | Hori | |
| 2008/0315918 A1 | * | 12/2008 | Luo et al. | 326/80 |
| 2009/0002027 A1 | * | 1/2009 | Lee | 326/80 |
| 2009/0315610 A1 | * | 12/2009 | Han et al. | 327/333 |

FOREIGN PATENT DOCUMENTS

JP    A-2002-315210    10/2002

OTHER PUBLICATIONS

U.S. Appl. No. 13/052,324, filed Mar. 21, 2011, Yamamoto et al.
Background Art Information Sheet provided by Applicants, Dec. 5, 2011 (1 page total).

* cited by examiner

*Primary Examiner* — Shawki Ismail
*Assistant Examiner* — Dylan White
(74) *Attorney, Agent, or Firm* — Posz Law Group, PLC

(57) ABSTRACT

A CMOS logic integrated circuit includes a level shifter and a CMOS logic circuit. The level shifter converts a signal of a first logic level to a signal of a second logic level. The signal of the first logic level changes between a first low potential and a first high potential higher than the first low potential. The signal of the second logic level changes between the first low potential and a second high potential higher than the first high potential. The CMOS logic circuit includes a first N-channel type MOSFET and a second N-channel type MOSFET. The second N-channel type MOSFET is connected in series with the first N-channel type MOSFET. A first signal of the first logic level is input into a gate of the first N-channel type MOSFET. A second signal of the second logic level has an inversion relationship with the first signal.

13 Claims, 3 Drawing Sheets

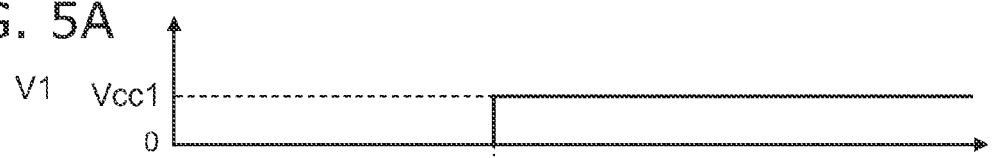
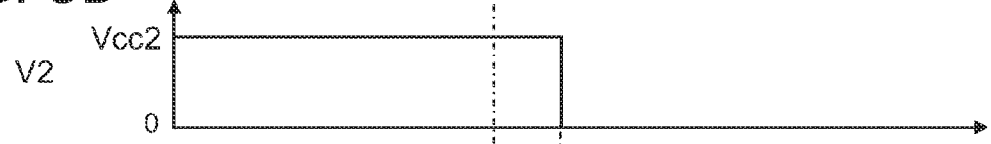
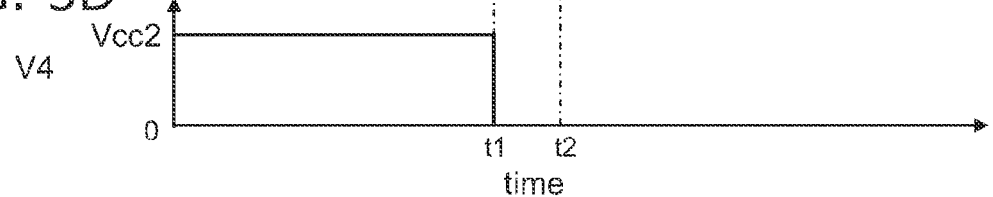
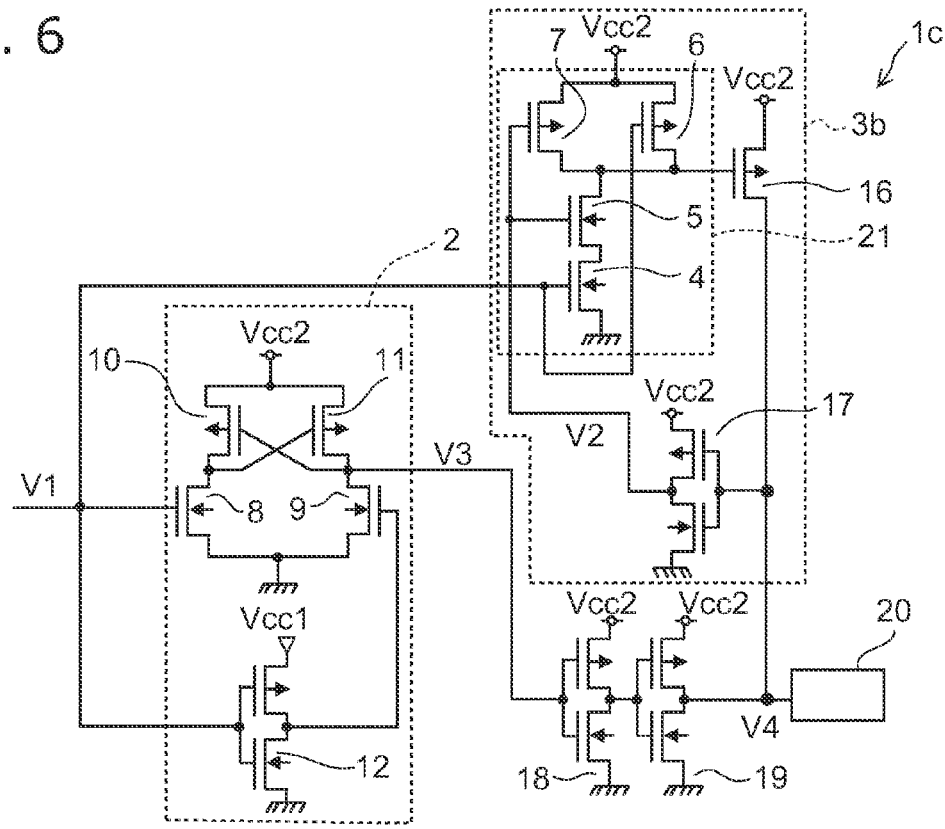

US 8,547,139 B2

CMOS LOGIC INTEGRATED CIRCUIT

CROSS-REFERENCE TO RELATED APPLICATIONS

This application is based upon and claims the benefit of priority from the prior Japanese Patent Application No. 2011-153101, filed on Jul. 11, 2011; the entire contents of which are incorporated herein by reference.

FIELD

Embodiments described herein relate generally to a CMOS logic integrated circuit.

BACKGROUND

Low voltage circuits are used in the integrated circuits such as CPUs along with the requirement for the low power consumption and fabrication of the devices. Whereas, there are some cases where a high voltage is required in systems to use traditional systems as well as analog signals. In these cases where systems operate different signal voltages, a level shifter is used to propagate signals between systems. However, the operating speed of the system is often limited by the response speed of the level shifter.

BRIEF DESCRIPTION OF THE DRAWINGS

FIG. 2A illustrates a first signal V1, FIG. 2B illustrates a second signal V2, FIG. 2C illustrates a signal V3, and FIG. 2D illustrates an output signal V4;

FIGS. 5A through 5D are waveform diagrams illustrating signals in the CMOS logic integrated circuit according to a third embodiment; FIG. 5A illustrates a first signal V1, FIG. 5B illustrates a second signal V2, FIG. 5C illustrates a signal V3, and FIG. 5D illustrates an output signal V4; and FIG. 6 is a circuit diagram illustrating a configuration of a CMOS logic integrated circuit according to a fourth embodiment.

DETAILED DESCRIPTION

Figure 1:
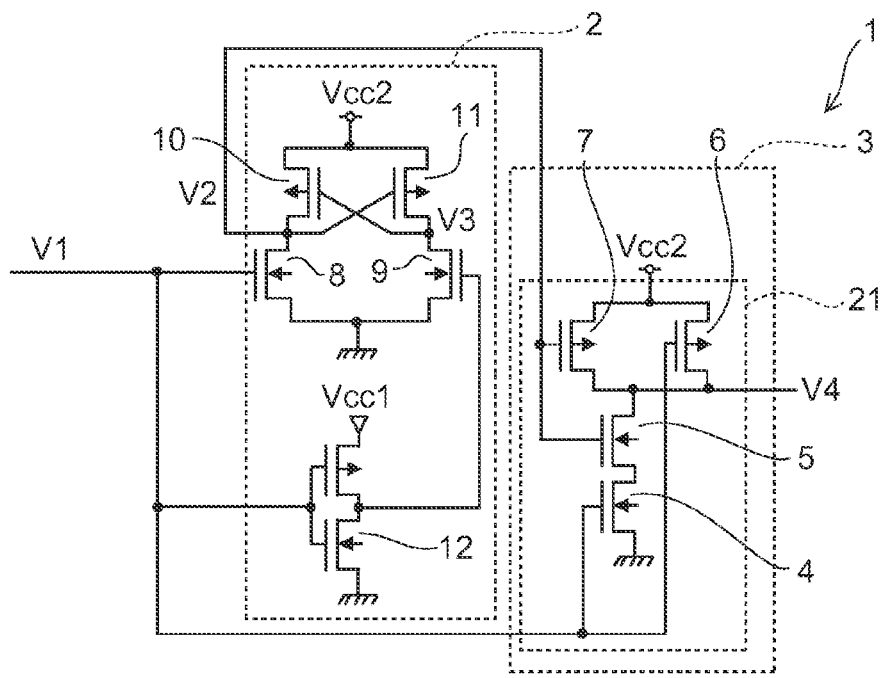
FIG. 1 is a circuit diagram illustrating a configuration of a CMOS logic integrated circuit according to a first embodiment.

In general, according to one embodiment, a CMOS logic integrated circuit includes a level shifter and a CMOS logic circuit. The level shifter converts a signal of a first logic level to a signal of a second logic level. The signal of the first logic level changes between a first low potential and a first high potential higher than the first low potential. The signal of the second logic level changes between the first low potential and a second high potential higher than the first high potential. The CMOS logic circuit includes a first N-channel type MOSFET and a second N-channel type MOSFET. The second N-channel type MOSFET is connected in series with the first N-channel type MOSFET. A first signal of the first logic level is input into a gate of the first N-channel type MOSFET. A second signal of the second logic level has an inversion relationship with the first signal and is input into a gate of the second N-channel type MOSFET.

Hereinbelow, embodiments are described with reference to the drawings. In the following description, identical components are marked with the same reference numerals, and a description of components once described is omitted as appropriate. The embodiments described below can be appropriately combined.

Firstly, a first embodiment is described.

FIG. 1 is a circuit diagram illustrating a configuration of a CMOS logic integrated circuit according to the first embodiment.

The CMOS logic integrated circuit 1 is provided with a level shifter (the section surrounded by a dotted line 2) that level shifts an input first signal V1 of a first logic level, and a CMOS logic circuit (the section surrounded by a dotted line 3) that generates a output signal V4 of a second logic level.

Here, the first signal V1 of a first logic level is a signal that changes to L or to H, between a first low potential $V1(l)$, and a first high potential $V1(h)$ higher than the first low potential $V1(l)$. Further, L and H are potentials, which are when the potential of the first signal V1 of the first logic level becomes the logic value 0 or the logic value 1, respectively.

The output signal V4 of the second logic level is a signal that changes to a low level or to a high level, between the first low potential $V1(l)$ and a second high potential $V2(h)$ higher than the first high potential $V1(h)$. Here, low level and high level are potentials which are when the potential of the output signal V4 of the second logic level is a logic value 0 or a logic value 1, respectively.

The level shifter 2 has a pair of N channel type MOSFET 8, 9 (hereinafter referred to as NMOS), and a pair of P channel type MOSFET 10, 11 (hereinafter referred to as PMOS) connected in series to the pair of NMOS. The level shifter 2 is composed of a differential circuit. Further, a first low potential $V1(l)$ and a second high potential $V2(h)$ are supplied to the level shifter 2. In FIG. 1 the first low potential $V1(l)$ is a ground potential of 0V, the first high potential $V1(h)$ is a first potential Vcc1, and the second high potential $V2(h)$ is a source potential Vcc2

The level shifter 2 has an inverter 12; further the first signal V1 and a signal which is an inverted signal of the first signal V1 by the inverter 12, are respectively input into each gate of the pair of NMOS 8, 9. To the inverter 12, a ground potential 0 V is supplied as the first low potential $V1(l)$ and a source potential Vcc1 is supplied as the first high potential $V1(h)$. Accordingly, the signal input into each gate of the pair of NMOS 8, 9 is a signal of a first logic level.

A second signal V2 is output from the drain of the NMOS 8 into which the first signal V1 is input. Further, an inverted signal by the inverter 12 is input into the NMOS 9; and a signal V3 of a second logic level is output from the drain of the NMOS 9. The second signal V2 of the second logic level and the signal V3 are differential signals. As described above, the second signal V2 is in an inversion relationship with the first signal V1, and the signal V3 of the second logic level is in phase with the first signal V1.

A CMOS logic circuit 3 has a circuit (NAND circuit 21) that generating an output signal V4 obtained from the logical complement of the logical AND of the first signal V1 and the second signal V2.

The NAND circuit 21 has a first NMOS 4 and a second NMOS 5 connected in series, and a first PMOS 6 and a second PMOS 7 connected in parallel.

A first low potential V1(*l*) of the ground potential 0 V and the source potential Vcc2 as a second high potential V2(*h*) are supplied to the CMOS logic circuit 3.

Next, the operation of the CMOS logic integrated circuit 1 is explained while referencing a timing chart.

Figure 2A:
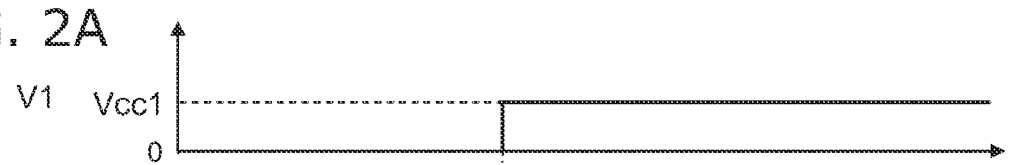
FIGS. 2A to 2D are waveform diagrams illustrating signals in a CMOS logic integrated circuit according to the first embodiment.
Figure 2B:
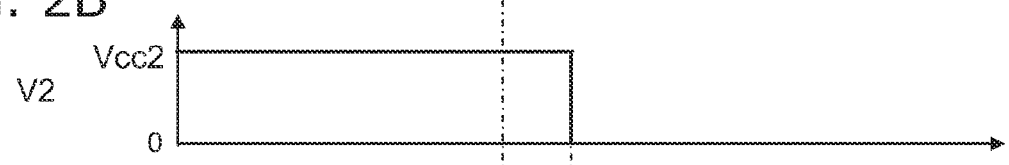
Figure 2C:
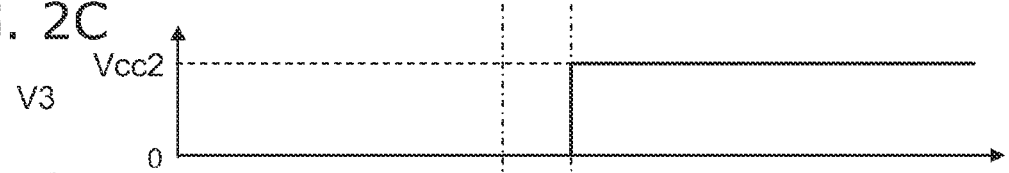
Figure 2D:
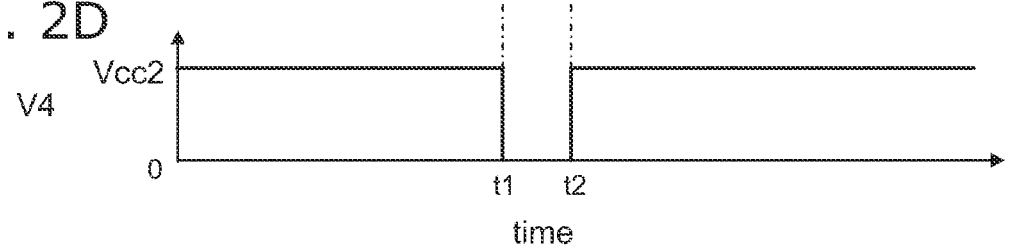

FIGS. 2A to 2D are waveform diagrams illustrating signals in a CMOS logic integrated circuit according to the first embodiment; FIG. 2A illustrates a first signal V1, FIG. 2B illustrates a second signal V2, FIG. 2C illustrates a signal V3, and FIG. 2D illustrates an output signal V4.

The input first signal V1 rises from L to H at a time t1 (FIG. 2A).

When a high (H) first signal V1 is input into the gate of the NMOS 8 of the level shifter 2, the NMOS 8 turns on and the NMOS 9 turns off.

Due to the NMOS 8 turning on, the second signal V2 is caught between the PMOS 10, which is on, and the NMOS 8 that was turned on. Then the NMOS 8 prompts the second signal V2 to fall from source potential Vcc2 until that point to a potential defined by the on resistance of the NMOS 8 and the on resistance of the PMOS 10 (FIG. 2B).

Further, due to the NMOS 9 turning off, the signal V3 of the second logic level is caught between the PMOS 11 that was turned off and the NMOS 9. For a short while the signal V3 is at its original potential, namely, low level, because of parasitic capacitance (FIG. 2C). When the potential of the second signal V2 deteriorates, the PMOS 11 turns on, prompting the potential of the signal V3 of the second logic level to rise (FIGS. 2B, 2C).

PMOS 10 turns off because of the rise of the signal V3 to the second logic level, and the NMOS 8 which is on, causes the second signal V2 to go to a ground potential 0 V (FIG. 2B). At this stage, the NMOS 8 and the PMOS 11 turn on, the NMOS 9 and the PMOS 11 turn off, current from the source potential Vcc2 is blocked, and the level shifter 2 does not consume power.

In this manner, the level shifter 2 shifts the voltage of the input signal from a first high potential V1(*h*)(=Vcc1) to a second high potential V2(*h*)(=Vcc2). When input and output are stable, the level shifter 2 does not consume power.

The level shifter 2 is, however, well known as a slow circuit. Normally, in a logic circuit, for example an inverter 12, the turning on of the NMOS and the turning off of the PMOS simultaneously and progressively occurs in accordance with the transition of an input signal. However, in the level shifter 2, the series mentioned above is necessary, and the operation is slow. The level shifter 2 is a differential type circuit, however, in other types of level shifters as well, generally operations end up being slower than that of normal logic circuits.

Namely, with respect to the change of the first signal V1 at time t1, the level shifter 2, is late, changing the second signal V2 (FIG. 2B) and the signal V3 (FIG. 2C) at time t2. Accordingly, it is impossible for logic circuits that operate with the output of the level shifter 2 to operate faster than the second signal V2 and the signal V3.

However, in the CMOS logic integrated circuit 1, the NAND circuit 21 of the CMOS logic circuit 3 performs a logic operation obtaining the logical complement of the logical AND of the first signal V1 and the second signal V2, generating the output signal V4 (FIG. 2D).

Accordingly, the first signal V1 of the first logic level is input into the gate of the first PMOS 6 as one of the inputs for NAND circuit 21.

When the input first signal V1 rises from L to H at time t1 (FIG. 2A), if the high (H) potential of the first signal V1 with respect to the second high potential V2(*h*)(=Vcc2) is less than or equal to a threshold value voltage Vth for the first PMOS 6, the first PMOS 6 cannot be turned off.

However, the NMOS 8 turns second signal V2 to go to a low level, little late after the first signal V1 becomes high (H), and at time t2 NMOS 5 turns off. Accordingly, current through the first PMOS 6 is blocked because of the second NMOS 5 being turned off. Hereafter, there is never a time when current flows.

In CMOS circuits, having static power consumption is a fatal disadvantage. For that reason, when systems operating with different source voltages are combined, level shifters have been used for propagating signals between systems without power consumption.

In the circuit 3, the first NMOS 4 and the second NMOS 5 are connected in series, and if the potential at the gate node of either NMOS is L or is at low level, there is no current path to ground, and there is no power consumption.

The CMOS logic circuit 3 consumes power when the first signal V1 is high (H) and the second signal V2 is at high level. However, the period is precisely the operating time of the level shifter 2. A normal CMOS circuit also has power consumption during circuit operation and that is permissible. The time the CMOS logic circuit 3 has power consumption is equivalent to the operation time of the level shifter 2; and there is no problem whatever.

Whereas, the CMOS logic circuit 3 generates the output signal V4 illustrated in FIG. 2D, and has provided two benefits. First benefit of the CMOS logic circuit 3 is that the potential of high level of V4 is the second high potential V2(*h*)(=Vcc2). This means that there is no problem even if the output signal V4 is input into the logic circuit of which high level is second high potential V2(*h*)(=Vcc2).

The second and more important benefit is that the CMOS logic circuit 3 generates the responding output signal V4 before the output of level shifter 2. The level shifter 2 outputs the second signal V2 and the signal V3 illustrated in FIGS. 2B and 2C. The CMOS logic circuit 3 generates the output signal V4 responding to the input at time t1, the time prior to the time t2 at which the second signal V2 and the signal V3 respond.

The CMOS logic circuit 3 generates, as the output signal V4, a transient signal that is from the time the input first signal V1 changes before the time the second signal V2 and the signal V3 change. However, the CMOS logic circuit 3 generates the output signal V4 of the second logic level which is the logic signal of second high potential V2(*h*) (=Vcc2) at high level, and there is no problem if the CMOS logic circuit 3 outputs other high levels to the logic circuits of Vcc2 and performs logic operations. Accordingly, the CMOS logic circuit 3 can mitigate the slow speed characteristics of the level shifter 2 by generating the output signal V4.

In this way the CMOS logic integrated circuit 1, can make a second high potential V2 (*h*) high level from an input first signal V1 of a first logic level, without generating steady power consumption, and generate an output signal V4 of a second logic level responding faster and prior to the output of the level shifter 2.

Therefore, according to the CMOS logic integrated circuit 1, signals of differing levels can be quickly propagated.

Figure 3:
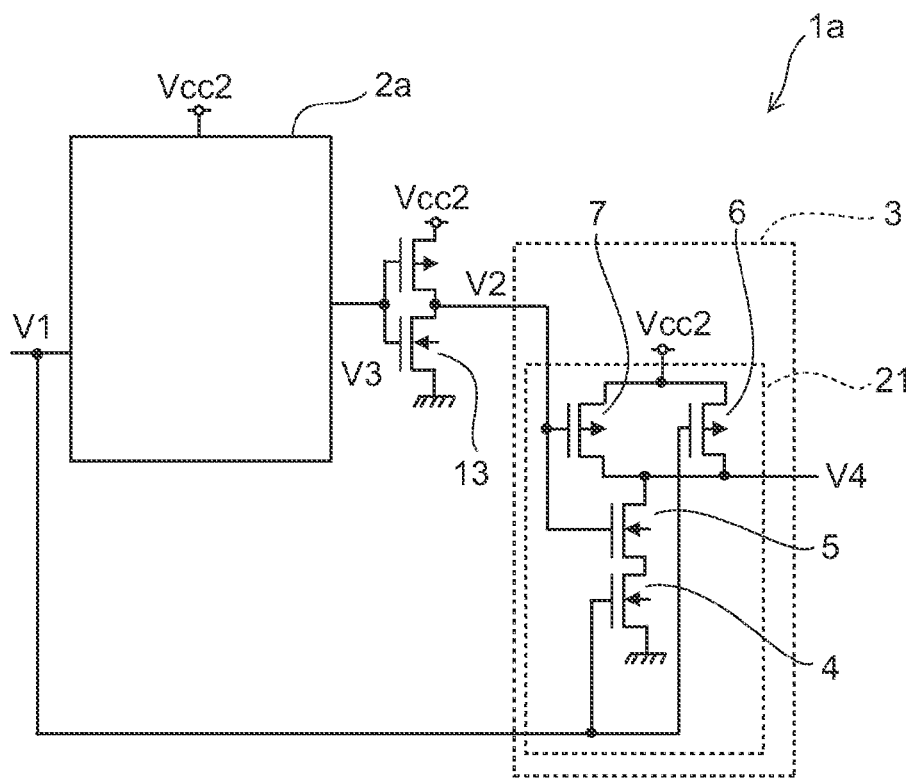
FIG. 3 is a circuit diagram illustrating a configuration of a CMOS logic integrated circuit according to a second embodiment.

FIG. 3 is a circuit diagram illustrating a configuration of a CMOS logic integrated circuit according to a second embodiment.

The CMOS logic integrated circuit 1a is composed of a level shifter of single output (the section surrounded by the dotted line 2a) replacing the level shifter 2 of the CMOS logic integrated circuit 1 illustrated in FIG. 1. The CMOS logic circuit 3 is the same as the CMOS logic circuit illustrated in FIG. 1. In addition, in FIG. 3 elements that are the same in FIG. 1 have the same reference numerals applied.

The level shifter 2a level shifts an input first signal V1 of a first logic level and outputs the level shifted signal V3 of a second logic level. The signal V3 of the second logic level has the same logical value of the first signal V1. The signal V3 of the second logic level is inverted by inverter 13, and input into the gate of the second NMOS 5 and the gate of the second PMOS 7 of the CMOS logic circuit 3 as a second signal V2 of a second logic level. The first signal V1 is input into the gate of the first NMOS 4 and the gate of the first PMOS 6.

The CMOS logic circuit 3 has a NAND circuit 21 and generates an output signal V4 of the second logic level which is the logical complement of the logical AND of the first signal V1 and the second signal V2.

Accordingly, the operation of the CMOS logic integrated circuit 1a is the same as the operation of the CMOS logic integrated circuit 1 illustrated in FIG. 1. A signal later than the signal V3 of the second logic level output from the level shifter 2a is input into the CMOS logic circuit 3 as the second signal V2.

However, it is acceptable to delay the time t2 at which the second signal V2 changes because the CMOS logic integrated circuit 1a generates the output signal V4 which responds and changes at the time the first signal is input, the time t1. In this manner, it is acceptable even if the inversion of the signal for generating the second signal V2 is implemented by a combination of a large number of gates.

Figure 4:
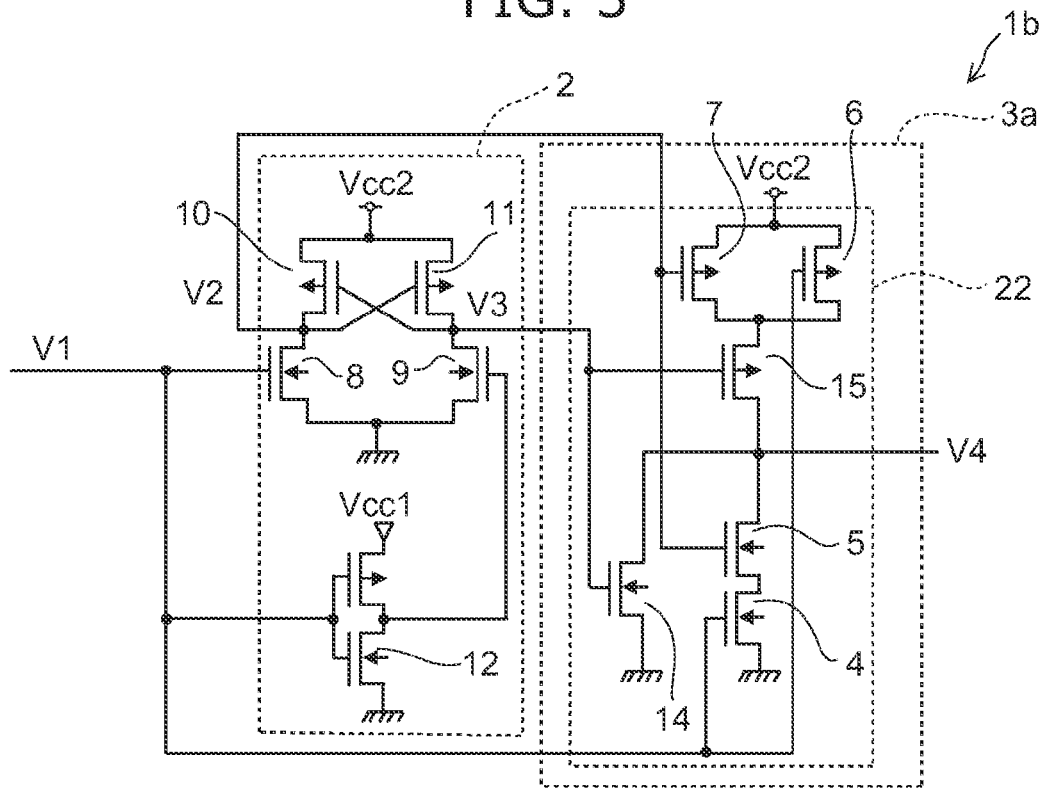
FIG. 4 is a circuit diagram illustrating a configuration of a CMOS logic integrated circuit according to a third embodiment.

FIG. 4 is a circuit diagram illustrating a configuration of a CMOS logic integrated circuit according to a third embodiment.

The CMOS logic integrated circuit 1b is composed of a CMOS logic circuit (the section surrounded by the dotted line 3a) replacing the CMOS logic circuit 3. The level shifter 2 is the same as the level shifter illustrated in FIG. 1. In addition, in FIG. 4, elements that are the same in FIG. 1 have the same reference numerals applied.

The CMOS logic circuit 3a has a composite circuit (AND-NOR circuit 22) which obtains the logical AND of two inputs and a logical complement of a logical OR of a single input.

The CMOS logic circuit 3a is configured by further adding a third NMOS 14 connected in parallel to the series-connected first NMOS 4 and second NMOS 5 in the CMOS logic circuit 3 illustrated in FIG. 1. Furthermore, a third PMOS 15 is connected in series to the second PMOS 7 and the first PMOS 6. The gate of the third PMOS 15 is connected to the gate of the third NMOS 14.

The signal V3 of the second logic level output from the level shifter 2 is input into each gate of the third NMOS 14 and the third PMOS 15. The first signal V1 is input into each gate of the first NMOS 4 and the first PMOS 6. Into the gate of the second NMOS 5 and the gate of the second PMOS 7 is input the second signal V2 of the second logic level output from the level shifter 2. The second signal V2 is in an inversion relationship with the first signal V1.

The CMOS logic circuit 3a generates an output signal V4 of a second logic level which is the logical complement of V1 AND V2 OR V3.

Next, the operation of the CMOS logic integrated circuit 1b will be explained while referring to a timing chart. Furthermore, the first high potential V1(h) is the source potential Vcc1, the first low potential V1(l) is the ground potential 0 V, and the second high potential V2(h) is the source potential Vcc2.

FIGS. 5A through 5D are waveform diagrams illustrating the signals in the CMOS logic integrated circuit according to a third embodiment; FIG. 5A illustrates a first signal V1, FIG. 5B illustrates a second signal V2, FIG. 5C illustrates a signal V3, and FIG. 5D illustrates an output signal V4.

The input first signal V1 rises from L to H at time t1 (FIG. 5A).

The operation of the level shifter 2 is similar to the level shifter of FIGS. 1 and 2A through 2D. The level shifter 2, similar to the level shifter illustrated in FIG. 2B and FIG. 2C, generates second signal V2 and the signal V3 (FIG. 5B, FIG. 5C).

The AND-NOR circuit 22 of the CMOS logic circuit 3a, as above mentioned, generates the output signal V4 of the second logic level obtained from the logical complement of V1 AND V2 OR V3 (FIG. 5D). When the signal V3 of the second logic level is high level, the PMOS 15 is off, and the third NMOS 14 is on. For that reason, current will not flow from the second high potential V2(h)(=Vcc2) regardless of whether the other PMOS is in the on or off state. Furthermore, the CMOS logic circuit 3a outputs a low level signal as the output signal V4, without relying on the state of the other NMOS.

Whereas, when the signal V3 of a second logic level is at low level, given that the PMOS 15 is on, and the third NMOS 14 is off, the CMOS logic circuit 3a has roughly the same characteristics as the two-input NAND CMOS logic circuit 3.

The CMOS logic circuit 3a generates the output signal V4 that becomes low level prior to the change at time t2 of the second signal V2 and the signal V3.

In this manner, the CMOS logic integrated circuit 1b can propagate the first signal V1 faster than the second signal V2 of the second logic level and the third signal is output by the level shifter 2. There is no steady power consumption in the CMOS logic integrated circuit 1b.

Moreover, other logic circuits may be used as the CMOS logic circuit, without being limited to the above mentioned cases where the CMOS logic circuit is a NAND circuit 21, or is an AND-NOR circuit 22. The CMOS logic circuit may have a first NMOS 4, a second NMOS 5 connected in series with first NMOS 4, and may be configured such that a first signal V1 of a first logic level and a second signal V2 of a second logic level, having an inversion relationship with the first signal V1, are input into the gate of the first NMOS 4 and the gate of the second NMOS 5.

FIG. 6 is a circuit diagram illustrating a configuration of a CMOS logic integrated circuit according to a fourth embodiment.

The CMOS logic integrated circuit 1c is composed of a CMOS logic circuit (the section surrounded by the dotted line 3b) replacing the CMOS logic circuit 3 in the CMOS logic integrated circuit 1 illustrated in FIG. 1. Moreover, inverters 18, 19 are added. The level shifter 2 is the same as the level shifter illustrated in FIG. 1. Furthermore, in FIG. 6, elements that are the same in FIG. 1 have the same reference numerals applied.

The inverters 18, 19 are buffers connected by a two-stage cascade connection. A signal V3 of a second logic level output from the level shifter 2 is input into the inverters 18, 19 and an output signal V4 of a second logic level in-phase with the signal V3 is output. In FIG. 6, the output of the inverter 19 is connected to a pad 20, and illustrates a configuration of output to the outside.

The CMOS logic circuit 3b is composed of a pull-up transistor 16, and an inverter 17 added to the CMOS logic circuit 3 illustrated in FIG. 1. Also, the gate of the first NMOS 4 and the gate of the first PMOS 6 are connected to the output of the inverter 17.

The pull-up transistor 16 is composed a PMOS, and the gate of the pull-up transistor 16 is connected to the output of the NAND circuit 21 comprised of first and second NMOS 4, 5, and first and second PMOS 6, 7. The second high potential V2(h)(=Vcc2) is supplied to the source of the pull-up transistor 16 and the drain is connected to the output of the inverter 19. The pull-up transistor 16 assists the rise of the output signal V4 from a low level to a high level and accelerates the operating speed.

The inverter 17 is connected to the output of the inverter 19, and inverts the output signal V4 of the second logic level, generating a second signal V2 of the second logic level, and outputting the result to the gate of the first NMOS 4 and the gate of the first PMOS 6.

The first signal V1 of the first logic level is input into the gate of the first NMOS 4 and the gate of the first PMOS 6. The second signal V2 is input into the gate of the second NMOS 5 and the gate of the second PMOS 7.

Accordingly, the operation of the CMOS logic integrated circuit 1c is the same as the CMOS logic integrated circuit 1 illustrated in FIG. 1 and the primary signals, for example, are illustrated in the same manner as the time chart illustrated in FIG. 2.

For example, during the state in which the potential of the pad 20 is in a steady state at low level, when the first signal V1 rises from L to H, the level shifter 2 outputs the signal V3 of a second logic level changed from a low level to a high level.

The signal V3 of the second logic level that was changed from low level to high level is input into the inverter 18. However, because the pad 20 is connected to the output of the inverter 19, the change of the output signal V4 of the second logic level is delayed by the external capacitance of the pad 20, and for a time the output signal V4 of the second logic level stays low level. If the output signal V4 is low level, the inverter 17 outputs the second signal V2 of the second logic level as high level. The output of the NAND circuit 21 composed of the first and second NMOS 4, 5 and the first and second PMOS 6, 7 become low level. Hereby, the pull-up transistor 16 is turned on, and in addition to the buffer comprised of the inverters 18, 19 the pull-up transistor 16 also drives the pad 20, causing the potential of the pad 20 to rise.

In the CMOS logic circuit 3b, because the pad 20 can also be driven by the pull-up transistor 16, the response of the output signal V4 can be accelerated. Whereas, once the potential of the pad 20 rises to what may be considered high level, the inverter 17 outputs a low level as the second signal V2. The NAND circuit 21 outputs a high level and the pull-up transistor 16 turns off. In this manner, the ability of the relevant circuits to be driven temporarily is enhanced.

The second signal V2 input into the gate of the first NMOS 4 and the gate of the first PMOS 6 is an inverted signal of the output signal V4. However, during a steady state the output signal V4 is the same logic value as the input first signal V1. Accordingly, the first signal V1 and the second signal V2, which an inverse of the first signal are input into the NAND circuit 21, and as previously described, the CMOS logic circuit 3b does not consume power in the steady state.

Further, the NAND circuit 21 outputs a low level from the time the first signal V1 becomes a high level, and turns on the pull-up transistor 16. The timing for the aforementioned operation of the NAND circuit 21 is prior to the output by the level shifter 2 of the signal V3 of the second logic level. Hereby, it is possible to cause a faster rise of the output signal V4.

Furthermore, in FIG. 6, the level shifter 2 illustrates the configuration of a differential type circuit similar to the level shifter 2 in FIG. 1. However, similarly to the CMOS logic integrated circuit 1a illustrated in FIG. 3, the single output level shifter 2a may also be employed. Further, the operation speed of the level shifter 2 will be of no problem.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A CMOS logic integrated circuit comprising:
   a level shifter configured to convert a signal of a first logic level to a signal of a second logic level, the signal of the first logic level changing between a first low potential and a first high potential higher than the first low potential, and the signal of the second logic level changing between the first low potential and a second high potential higher than the first high potential; and
   a CMOS logic circuit including:
      a first N-channel type MOSFET and a second N-channel type MOSFET connected in series with the first N-channel type MOSFET, a first signal of the first logic level being input into a gate of the first N-channel type MOSFET, a second signal of the second logic level having an inversion relationship with the first signal and being input into a gate of the second N-channel type MOSFET; and
      a pull-up transistor, a gate of the pull-up transistor being connected to the first N-channel type MOSFET and the second N-channel type MOSFET, and the signal of the second logic level being input into a source of the pull-up transistor.

2. The circuit according to claim 1, wherein the first signal is an input signal to the level shifter.

3. The circuit according to claim 1, wherein the second signal is an output signal of the level shifter.

4. The circuit according to claim 1, wherein the second signal is different from an output signal of the level shifter.

5. The circuit according to claim 4, wherein the second signal is an inverted signal of the output signal of the level shifter.

6. The circuit according to claim 1, wherein the second signal is an inverted signal of the signal of the second logic level input into the source of the pull-up transistor.

7. The circuit according to claim 1, further comprising a pad connected to the source of the pull-up transistor.

8. The circuit according to claim 1, wherein the level shifter is a differential circuit.

9. The circuit according to claim 1, wherein the level shifter is a single output circuit.

10. A CMOS logic integrated circuit comprising:
   a level shifter configured to convert a signal of a first logic level to a signal of a second logic level, the signal of the first logic level changing between a first low potential and a first high potential higher than the first low potential, and the signal of the second logic level changing between the first low potential and a second high potential higher than the first high potential; and
   a CMOS logic circuit including:
      a first N-channel type MOSFET and a second N-channel type MOSFET connected in series with the first N-channel type MOSFET, a first signal of the first logic level being input into a gate of the first N-channel type MOSFET, a second signal of the second logic level having an inversion relationship with the first signal and being input into a gate of the second N-channel type MOSFET;

a first P-channel type MOSFET connected in series with the first N-channel type MOSFET and the second N-channel type MOSFET; and a second P-channel type MOSFET connected in series with the first N-channel type MOSFET and the second N-channel type MOSFET.

11. A CMOS logic integrated circuit comprising:

a level shifter configured to convert a signal of a first logic level to a signal of a second logic level, the signal of the first logic level changing between a first low potential and a first high potential higher than the first low potential, and the signal of the second logic level changing between the first low potential and a second high potential higher than the first high potential; and a CMOS logic circuit including:

a first N-channel type MOSFET and a second N-channel type MOSFET connected in series with the first N-channel type MOSFET, a first signal of the first logic level being input into a gate of the first N-channel type MOSFET, a second signal of the second logic level having an inversion relationship with the first signal and being input into a gate of the second N-channel type MOSFET;

a NAND circuit including the first N-channel type MOSFET and the second N-channel type MOSFET; and a pull-up transistor, a gate of the pull-up transistor being connected to the first N-channel type MOSFET and the second N-channel type MOSFET, and the signal of the second logic level being input into a source of the pull-up transistor.

12. The circuit according to claim 11, wherein the second signal is an inverted signal of the signal of the second logic level input into the source of the pull-up transistor.

13. The circuit according to claim 11, further comprising a pad connected to the source of the pull-up transistor.

* * * * *